(12) United States Patent
Kono

(10) Patent No.: US 6,929,822 B2
(45) Date of Patent: Aug. 16, 2005

(54) METHOD FOR MANUFACTURING OPTICAL MEMBER HAVING WATER-REPELLENT THIN FILM

(75) Inventor: Shigetoshi Kono, Tokyo (JP)

(73) Assignee: Hoya Corporation, Tokyo (JP)

( * ) Notice: Subject to any disclaimer, the term of this patent is extended or adjusted under 35 U.S.C. 154(b) by 52 days.

(21) Appl. No.: 10/132,519

(22) Filed: Apr. 26, 2002

(65) Prior Publication Data

US 2003/0003227 A1 Jan. 2, 2003

(30) Foreign Application Priority Data

Apr. 27, 2001 (JP) ........................ 2001-133577

(51) Int. Cl.⁷ ..................... C23C 14/12; C23C 14/24; C23C 14/56; G02C 7/02; G02B 1/11
(52) U.S. Cl. ................. 427/164; 427/162; 427/255.5; 427/255.6; 427/255.7; 351/166; 351/177; 359/580; 359/581
(58) Field of Search ............................. 427/162, 164, 427/166, 167, 255.5, 255.6, 255.7, 566, 585, 593; 118/726, 730, 733; 351/159, 166, 177; 359/580, 581

(56) References Cited

U.S. PATENT DOCUMENTS

| | | | | |
|---|---|---|---|---|
| 4,130,672 A | * | 12/1978 | Onoki et al. | 427/164 |
| 4,678,688 A | | 7/1987 | Itoh et al. | |
| 4,765,729 A | | 8/1988 | Taniguchi | |
| 5,709,753 A | * | 1/1998 | Olson et al. | 118/719 |
| 5,853,800 A | * | 12/1998 | Dombrowski et al. | 427/162 |
| 6,136,725 A | * | 10/2000 | Loan et al. | 438/758 |
| 6,183,872 B1 | * | 2/2001 | Tanaka et al. | 428/429 |
| 6,264,751 B1 | * | 7/2001 | Kamura et al. | 118/725 |
| 6,296,793 B1 | * | 10/2001 | Anthes et al. | 264/104 |
| 6,542,302 B2 | * | 4/2003 | Cross | 359/581 |
| 6,833,159 B1 | * | 12/2004 | Boulineau et al. | 427/167 |

FOREIGN PATENT DOCUMENTS

| | | |
|---|---|---|
| EP | 0 842 711 A1 | 5/1998 |
| JP | 60-221470 | 11/1985 |
| JP | 62-148902 | 7/1987 |
| JP | 4-355404 | 12/1992 |
| JP | 5-215905 | 8/1993 |
| JP | 05-215905 A * | 8/1993 |
| JP | 9-111223 | 4/1997 |
| JP | 9-157582 | 6/1997 |
| JP | 9-202648 | 8/1997 |
| JP | 9-263728 | 10/1997 |
| JP | 10-319208 A * | 12/1998 |
| JP | 2000-80465 A | 3/2000 |
| WO | WO 98/52075 A1 * | 11/1998 |

OTHER PUBLICATIONS

European Search Report issued in Aplication No. EP 02 00 9645, Mar. 3, 2004.

* cited by examiner

Primary Examiner—Timothy Meeks
Assistant Examiner—Wesley D. Markham
(74) Attorney, Agent, or Firm—Burns, Doane, Swecker & Mathis, L.L.P.

(57) ABSTRACT

A method for manufacturing an optical member by vapor depositing an antireflective film on a plastic optical member and vapor depositing a water-repellent thin film over the antireflective film. The vapor deposition of the water-repellent thin film is conducted by evaporating a fluorine-containing organic silicon compound in which the plastic optical member does not exceed the maximum temperature during the vapor deposition of the antireflective film. The heating for evaporation comprises a first stage where the temperature is raised from an ordinary temperature to the prescribed temperature (1) not exceeding the starting temperature of vapor deposition of the compound, and the second stage where the temperature is raised from the prescribed temperature (1) to the prescribed temperature (2) equal to or higher than the starting temperature of the vapor deposition. The rate of raising temperature of the first stage of raising temperature is higher than that of the second stage.

10 Claims, 5 Drawing Sheets

A schematic view of the flow of processing
in a continuous-type vacuum vapor deposition device A side view of opening and closing platform of
second vapor deposition chamber

METHOD FOR MANUFACTURING OPTICAL MEMBER HAVING WATER-REPELLENT THIN FILM

FIELD OF THE INVENTION

The present invention relates to a method for manufacturing a plastic optical member having an antireflective film and a water-repellent film.

RELATED ART

An antireflective film formed by the vapor deposition of multiple layers of inorganic oxides is generally provided on optical members such as plastic lenses. This multilayer vapor-deposited film is generally comprised of, for example, a high refractive index layer of $ZrO_2$, $TiO_2$, or the like, and a low refractive index layer of $SiO_2$, $AlO_2$, or the like, with the outermost layer generally being the low refractive index layer. Thus, grime from sweat and fingerprints tend to adhere, and such grime is often difficult to remove. As methods of solving this problem, for example, Japanese Unexamined Patent Publication (KOKAI) Nos. Showa 60-221470 and 62-148902 disclose methods of soaking and curing, or coating and curing, a resin (optical substrate) in a diluted solution of perfluoroalkyl-group substituted ammonium silane to form a water-repellent film over an antireflective film. Japanese Unexamined Patent Publication (KOKAI) Heisei No. 5-215905 discloses a method of forming a thin film over an antireflective film from a diluted solution of m-xylene hexachloride by vacuum vapor deposition.

Further, Japanese Unexamined Patent Publication (KOKAI) Heisei No. 5-215905 proposes a method wherein a porous material in the form of a sintered filter obtained by sintering a highly thermally conductive metal powder of copper or the like is impregnated with a water-repellency treatment solution obtained by diluting a fluorine-containing silazane organic silicon compound with a fluorine solvent such as xylylene hexafluoride, trichloromonofluoromethane, or the like; and applying heat during vacuum vapor deposition to form a film on an optical member.

The water-repellency of the thin films formed by the methods disclosed in Japanese Unexamined Patent Publication (KOKAI) Showa Nos. 60-221470 and 62-148902 has drawbacks in the form of poor durability and water repellency that drops precipitously with use.

By contrast, the method disclosed in Japanese Unexamined Patent Publication (KOKAI) Heisei No. 05-215905 improves durability and characteristics of change over time in comparison with the conventional methods by vacuum vapor deposition of an organic silicon compound.

However, the fluorine-containing organic silicon compound disclosed in Japanese Unexamined Patent Publication (KOKAI) Heisei No. 05-215905 is of high molecular weight and has a high boiling point. Accordingly, because heating to an elevated temperature is required when employing vacuum vapor deposition, depending on the heating conditions, there are possibilities that the surface temperature of the optical member may be raised by the influence of the heat and damages such as thermal cracking of the antireflective layer may be caused. In particular, since the boiling point increases further when the degree of vacuum is low, the influence of the heat becomes significant. Further examples of water-repellent agents comprising fluorine-containing organic silicon compounds are disclosed in Japanese Unexamined Patent Publication (KOKAI) Heisei Nos. 9-157582, 9-202648 and 9-263728.

Since the compounds disclosed in Japanese Unexamined Patent Publication (KOKAI) Heisei Nos. 9-157582, 9-202648 and 9-263728 have a high fluorine content, improvement in water repellency, durability and the like can be anticipated. However, since the molecular weight thereof is even greater, the boiling point increases further, and the influence of heat is even greater than in the compound disclosed in Japanese Unexamined Patent Publication (KOKAI) Heisei No. 05-215905. Further, since more time is required in the bonding reaction to the antireflective film for these compounds than for the compound disclosed in Japanese Unexamined Patent Publication (KOKAI) Heisei No. 05-215905, it was difficult to set the vapor deposition conditions. To reduce the influence of heat, it suffices to raise the temperature rapidly; however, depending on the vapor deposition conditions, nonuniformity sometimes occurs in the water-repellent film formed due to the short vapor deposition time.

Further, a vapor deposition device is employed to form the antireflective film on optical members such as plastic lenses when the antireflective film is a multilayer vapor deposited film comprised of inorganic oxides. Accordingly, when forming a water-repellent film by vapor deposition method on an antireflective film formed by such a vapor deposition device, it is desirable to continuously form the antireflective film and the water-repellent film. However, as set forth above, in optical members provided with antireflective films, damages in the form of thermal cracking and the like sometimes occur depending on the temperature conditions during the formation of the water repellent film, and problems particularly tend to occur due to the high temperature of vapor deposition when continuously forming a water repellent film by vapor deposition of a fluorine-containing organic silicon compound with a high boiling point due to the comparatively high molecular weight as mentioned above, and an antireflective film.

When conducting such continuous vapor deposition in a single vapor deposition chamber, if the antireflective film adheres over the water-repellent film adhering to the inner walls of the vapor deposition chamber, the antireflective film that has adhered over water-repellent film tends to peel off because the antireflective film tends not to adhere to the water-repellent film. When this adheres to the lens during film formation, flawed film formation sometimes results. Thus, the idea of using a continuous processing device separated into a vapor deposition chamber for vapor deposition of the antireflective film ("first vapor deposition chamber" hereinafter) and a vapor deposition chamber for vapor deposition of the water-repellent film ("second vapor deposition chamber" hereinafter) was conceived.

However, in such a device, an opening and closing mechanism for retrieving the vapor deposited product and a mechanism for conveying the vapor deposited product are sometimes provided in the second vapor deposition chamber. Thus, there are cases that there is not enough distance between the vapor deposition substance and the vapor deposited product, and irregularities in the water-repellent film develop due to these mechanisms being impediments when the vapor deposition substance is evaporated rapidly. Further, since the chamber must be opened each time a vapor deposited product is removed and heat dispersion efficiency must be increased by reducing the degree of vacuum for cooling prior to retrieval, a degree of vacuum may be low in the second vapor deposition chamber. In such a case, the starting temperature of vapor deposition increases and there is a possibility that the above-described problems tend to occur.

Accordingly, an object of the present invention is to provide a method for manufacturing a plastic optical member having a water-repellent thin film with good water repellency, durability, abrasion resistance and the like on an antireflective layer, wherein a water repellent film is formed, continuously with forming an antireflective film, by vacuum vapor deposition using a fluorine-containing organic silicon compound with a high boiling point due to its relatively high molecular weight, as set forth above.

SUMMARY OF THE INVENTION

The present inventors conducted extensive research to achieve the above-stated object, resulting in the discovery that by prescribing the conditions for vapor deposition of the above-mentioned water-repellent thin film and the temperature conditions within the evaporation temperature range of the fluorine compound, it was possible to rapidly vapor deposit the antireflective film without damage such as thermal cracking and without irregularity.

The present invention relates to a method for manufacturing an optical member having a water-repellent thin film wherein an antireflective film is vapor deposited on a plastic optical member and then a water-repellent thin film is vapor deposited on the antireflective film, wherein said vapor deposition of the water-repellent thin film is conducted by heating and evaporating a fluorine-containing organic silicon compound under condition in which the temperature of said plastic optical member does not exceed the maximum temperature at which the plastic optical member is exposed during the vapor deposition of the antireflective film, and adhering the evaporated fluorine-containing organic silicon compound on the plastic optical member having the antireflective film, and said heating is conducted so as to comprise a first stage of raising temperature where the temperature is raised from an ordinary temperature to the prescribed temperature (1) not exceeding the starting temperature of vapor deposition of said fluorine-containing organic compound, and a second stage of raising temperature where the temperature is raised from said prescribed temperature (1) to the prescribed temperature (2) equal to or higher than said starting temperature of vapor deposition, with the rate of raising temperature of the first stage of raising temperature higher than the rate of raising temperature of the second stage of raising temperature.

In the method according to the present invention, the evaporation of fluorine-containing organic silicon compound is preferably conducted by heating a porous material impregnated with said fluorine-containing organic silicon compound with a heating means.

In the method according to the present invention, the vapor deposition of antireflective film and said vapor deposition of water-repellent thin film are preferably conducted by sequentially moving a jig for holding multiple plastic optical members to a vapor deposition chamber of said antireflective film and a vapor deposition chamber of said water-repellent thin film.

In the method according to the present invention, the fluorine-containing organic silicon compound preferably comprises a fluorine compound having a molecular weight of 3,500–6,500 represented by general formula (I) below:

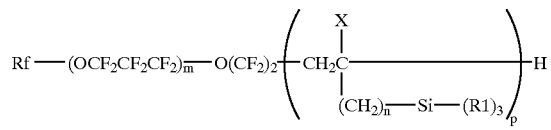

wherein Rf denotes a straight-chain perfluoroalkyl group having 1–16 carbon atoms, X denotes hydrogen or a lower alkyl group, R1 denotes a hydrolyzable group, m denotes an integer of 1–50, n denotes an integer of 0–2, and p denotes an integer of 1–10.

In the method using fluorine compound represented by general formula (I), the second stage of raising temperature is preferably conducted at a temperature within a range of 450–660° C., and the rate of raising temperature in said second stage of raising temperature preferably ranges from 0.4° C./s to 1.7° C./s.

In the method according to the present invention, the fluorine-containing organic silicon compound preferably comprises a fluorine compound having a molecular weight of 300–700 represented by general formula (II) below:

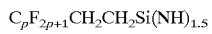

wherein p denotes an integer of not less than 1.

In method using the fluorine compound represented by general formula (II), the second stage of raising temperature is preferably conducted at a temperature within a range of 400–610° C., and the rate of raising temperature in said second stage of raising temperature preferably ranges from 0.4° C./s to 1.7° C./s.

DETAILED EXPLANATION OF THE INVENTION

The present invention will be described in detail below.

In the method for manufacturing an optical member of the present invention, an antireflective film is vapor deposited on a plastic optical member and then a water-repellent film is vapor deposited on the antireflective film; this method is particularly suited to the vapor deposition of water-repellent films under low degree of vacuum.

Vapor deposition processing methods generally comprise methods conducted with a batch-type vacuum vapor deposition device and methods conducted with a continuous-type vacuum vapor deposition method. The present invention is particularly suited to methods with continuous-type vacuum vapor deposition devices. The continuous-type vacuum vapor deposition device employed in the present invention is desirably provided with a vacuum vapor deposition chamber for antireflective films continuously with a vacuum vapor deposition chamber for water-repellent thin films. Sequentially providing an antireflective film processing chamber and a water-repellent film processing chamber in this manner permits efficient processing and short cycle time.

In the manufacturing method according to the present invention, as described further below, since vapor deposition of the water-repellent thin film is conducted under a degree of vacuum lower than the degree of vacuum in the vapor deposition of the antireflective film, the water-repellent film processing chamber can be employed as a vacuum breaking chamber of a continuous-type vacuum vapor deposition device. Continuously conducting the vapor deposition of the antireflective film and the water-repellent thin film can reduce adhesion to the lens surface of grime resulting from vapor deposition substances in the vacuum chamber, results in more stable production of water-repellent processing films, and also improves the process-yield.

The manufacturing method according to the present invention will be described based on FIG. 1.

Figure 1:
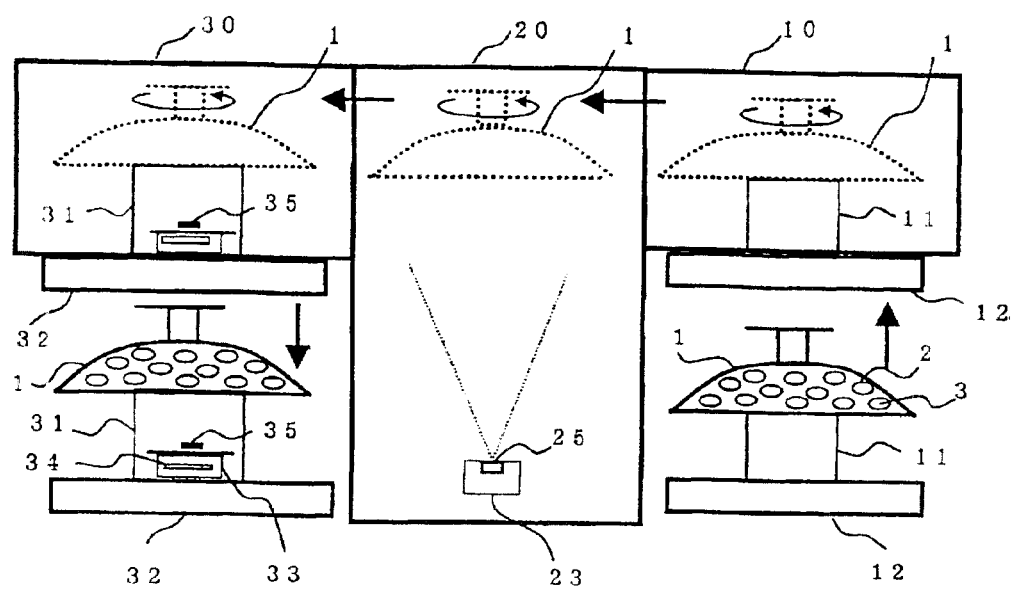
FIG. 1 is a schematic view of the flow of vapor deposition processing in a continuous-type vacuum vapor deposition device.
Figure 1:
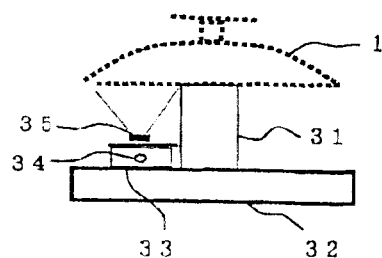
Figure 2:
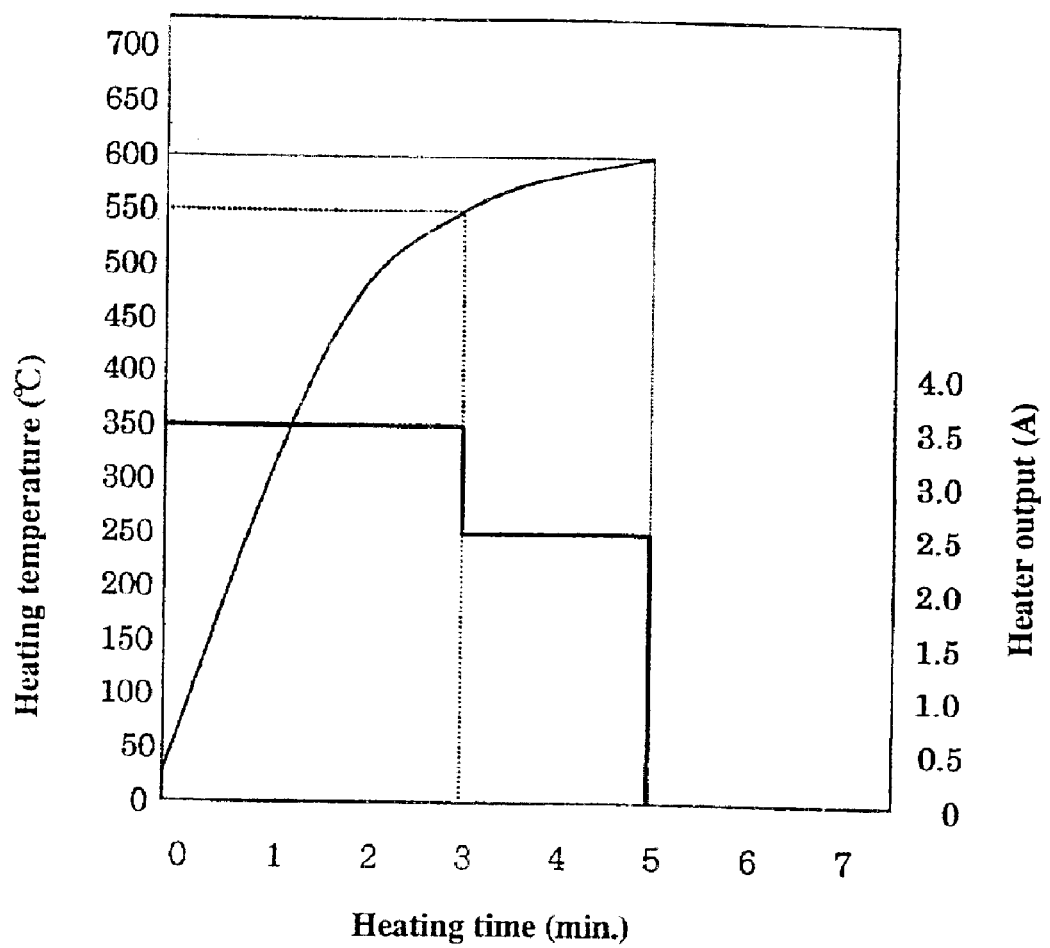
FIG. 2 is a graph showing the temperature of the sintered filter and the output value of the heating device in Example 1.

FIG. 1 is a schematic view of the flow of vapor deposition processing in a continuous-type vacuum vapor deposition device.

In the figure, 10 denotes a preheating chamber (CH1), 20 denotes first vapor deposition chamber (CH2), 30 denotes second vapor deposition chamber (CH3), and 11 and 31 denote lens supporting jig platforms supporting lens supporting jig 1. First, a lens 3 is held in the lens mounting opening 2 of support jig 1. In this state, lens support jig 1 is loaded onto lens supporting jig platform 11 positioned on the opening and closing platform 12 of the preheating chamber and transferred to preheating chamber (CH1) 10 with closing opening and closing platform of the preheating chamber. After raising a degree of vacuum in preheating chamber (CH1) 10, heating is conducted to a temperature suited to vapor deposition and lens supporting jig 1 is transferred to first vapor deposition chamber (CH2) 20. In first vapor deposition chamber (CH2) 20, vapor deposition substance (A) 25 for antireflective film is heated by heating source 23 and an antireflective film is vapor deposited. During vapor deposition, lens supporting jig 1 is rotated to vapor deposit multiple lenses uniformly. After vapor deposition of the antireflective film has been completed, lens supporting jig 1 is transferred to second vapor deposition chamber (CH3) 30. In second vapor deposition chamber (CH3) 30, lens supporting jig 1 is loaded onto lens supporting jig platform 31 on opening and closing platform 32 of second vapor deposition chamber. In second vapor deposition chamber (CH3) 30, vapor deposition substance (B) 35 for water-repellent thin film is heated by heating device 33 to vapor deposit a water-repellent thin film. During the vapor deposition, the lens supporting jig is also rotated to vapor deposit multiple lenses uniformly. After vapor deposition of the water-repellent thin film has been completed, the product is left standing for a prescribed time to lower the temperature, after which opening and closing platform 32 of second vapor deposition chamber falls down and lenses on which antireflective films and water-repellent thin films have been formed are retrieved from lens supporting jig 1.

In the method for manufacturing optical members according to the present invention, the vapor deposition of the water-repellent thin film is conducted by heating and evaporating a fluorine-containing organic silicon compound under the condition where the temperature of said plastic optical member does not exceed the maximum temperature at which the plastic optical member is exposed during the vapor deposition of said antireflective film, and adhering the evaporated fluorine-containing organic silicon compound on the plastic optical member having said antireflective film.

The surface of the plastic optical member during vapor deposition of the water-repellent thin film is set to not exceed the maximum temperature of the plastic optical member exposed during the vapor deposition of said antireflective film. This advantageously prevents thermal cracking of the antireflective film. The maximum temperature of the plastic optical member (optical member surface) during vapor deposition of the antireflective film normally falls within a range of 85 to 110° C., and the temperature of the surface of the optical member during vapor deposition of the water-repellent thin film is desirably 15 to 25° C. lower. The degree of vacuum during vapor deposition of the water-repellent thin film can be comparatively low, for example, $10^{-2}$ to $10^{-4}$ Torr.

The heating during vapor deposition of the water repellent thin film is conducted so as to comprise the first stage of raising temperature where the temperature is raised from an ordinary temperature to the prescribed temperature (1) not exceeding the starting temperature of vapor deposition of said fluorine-containing organic compound, and the second stage of raising temperature where the temperature is raised from said prescribed temperature (1) to the prescribed temperature (2) equal to or higher than said starting temperature of vapor deposition, with the rate of raising temperature of the first stage of raising temperature higher than the rate of raising temperature of the second stage of raising temperature.

The temperature at which evaporation of the fluorine-containing organic silicon compound starts is determined by the type (molecular weight and composition) of fluorine-containing organic silicon compound, degree of vacuum and the like. However, in the case of the fluorine-containing organic silicon compound represented by general formula (I) described further below, the temperature at which evaporation starts at a degree of vacuum of $10^{-2}$ to $10^{-4}$ Torr falls within a range of about 470–620° C. In the case of the fluorine-containing organic silicon compound represented by general formula (II), the temperature at which evaporation starts at a degree of vacuum of $10^{-2}$ to $10^{-4}$ Torr falls within a range of about 420–570° C. Further, the prescribed temperature (1) that is lower than the temperature at which evaporation of the fluorine-containing organic silicon compound starts is desirably, for example, 10–20° C. lower than the temperature at which evaporation of the fluorine-containing organic silicon compound starts in view of controlling the rate of evaporation to achieve uniform film formation on multiple optical members. Further, the prescribed temperature (2) that is equal to or higher than the temperature at which evaporation starts is also desirably 40–60° C. higher than the prescribed temperature (1) in view of controlling the rate of evaporation to achieve uniform film formation on multiple optical members.

The rate of raising temperature in the first stage of raising temperature is set to greater than the rate of raising temperature in the second stage of raising temperature. Since the fluorine-containing organic silicon compound employed in the manufacturing method of the present invention is of comparatively high molecular weight, it has a high evaporation temperature. Thus, there is a possibility that a large quantity of fluorine-containing compound will evaporate in a short period when the temperature is increased rapidly, resulting in nonuniformity in the water-repellent thin film obtained. However, when heating is conducted with a rate of raising temperature that is gradual from the start, not only the time required for vapor deposition increase and production efficiency decrease, but also heat spreads to the substrate positioned in the vapor deposition chamber, imparting thermal influences (for example, heat cracking and the like in the antireflective film) to the substrate and antireflective film that has been formed on the substrate. Accordingly, to shorten the period of heating the vapor deposited composition and form a uniform film, temperature is raised sharply in the first stage of raising temperature at which the temperature is lower than an evaporation temperature range. In the second stage of raising temperature including the evaporation temperature range, temperature is raised with a moderate gradient. The rate of raising temperature in the second stage of raising temperature preferably ranges from 0.4° C./s to 1.7° C./s in view of forming films on multiple optical members uniformly.

The fluorine-containing organic silicon compound is charged to a suitable container and evaporated by heating. Evaporation of the fluorine-containing organic silicon compound is desirably conducted by heating a porous material impregnated with the fluorine-containing organic silicon compound with a heating means. The fluorine-containing organic silicon compound is dissolved in a suitable fluorine solvent, the solution obtained is impregnated into the porous material, the solvent is removed if necessary, and the product is subjected to heating and vapor deposition. The use of a porous material permits the achievement of a suitable vapor deposition rate.

Examples of the solvents used to dilute the fluorine-containing organic silicon compound include m-xylene hexafluoride, perfluorohexane and hydrofluoroether. A concentration ranging from 1–10 percent is suitable. The fluorine compound solution may be charged to a container and heated as it is, but it is further desirable to impregnate into a porous material. This is because heat can be uniformly transmitted and a suitable evaporation rate can be achieved to form a uniform film without individual variation.

More specifically, fluorine compound (I) or (II) is heated and evaporated under vacuum to form a thin film on optical members. Basically, the thickness of the thin film changes depending on the amount of fluorine compound (I) or (II) that is evaporated. Further, in the present invention, since a thin film having good water repellency without compromising the characteristics of the antireflective film can be obtained by controlling the thickness of the thin film at the Angstrom level, it is desirable to more precisely regulate the amount of fluorine compound (I) or (II) that is evaporated. Accordingly, to more precisely apportion the compound, fluorine compound (I) or (II) dissolved in a fluorine solvent such as perfluorohexane or hydrofluoroether can be used. Diluting fluorine compound (I) or (II) facilitates impregnation into the porous material. The concentration of fluorine compound (I) or (II) in the solution can be suitably determined based on the type of fluorine compound (I) or (II) or the like. A degree of dilution of 1–10 percent is suitable.

More specifically, the porous material can be a sintered filter obtained by sintering a metal powder of high thermal conductivity such as copper or stainless steel. Further, in view of achieving a suitable vapor deposition rate, a porous material mesh of 40–200 microns, preferably 80–120 microns, is suitable. Regulation of the vapor deposition rate within a range of $1\times10^{-3}$ mg/cm$^2$ second to $1\times10^{-5}$ mg/cm$^2$ second is desirable to achieve a uniform thin film. Adjustment of the above-stated conditions permits achieving a vapor deposition rate falling within this range.

As a method for heating said fluorine-containing organic silicon compound, a method where a sample that has been placed on a resistance heating source in the form of a boat is heated and a method where heating is conducted by directly irradiating a weak electron beam can be used. A method where indirect heating is conducted by heating a heating stage made of copper, molybdenum or the like by an infrared irradiation source 34 such as halogen heater can be used, which is more preferred in view of stable vapor deposition rate and vapor deposition distribution without sudden temperature change near the target temperature. Further, stable production can be implemented through device size reduction and increased maintenance efficiency.

For example, the above described fluorine containing organic silicon compound desirably comprises a fluorine compound having a molecular weight of 3,500 to 6,500 represented by general formula (I) below:

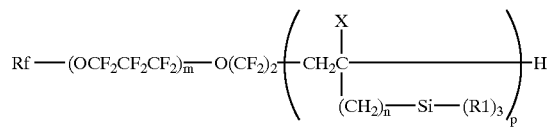

wherein Rf denotes a straight-chain perfluoroalkyl group having 1–16 carbon atoms, X denotes hydrogen or a lower alkyl group, R1 denotes a hydrolyzable group, m denotes an integer of 1–50, n denotes an integer of 0–2, and p denotes an integer of 1–10.

Such fluorine-containing organic silicon compounds are commercially available.

The above-described fluorine compound (I) has a high fluorine content; good water repellency, durability, and sliding properties; but its evaporation temperature is higher than those conventionally used because of its high molecular weight. Thus, there is a possibility of the antireflective film being affected by heat. When the temperature is raised sharply to prevent this, there is a possibility of nonuniformity developing due to the evaporation of a large quantity of fluorine compound in a short period. Accordingly, in the manufacturing method according to the present invention, as set forth above, the temperature is raised with a moderate gradient to evaporate in the evaporation temperature range of the fluorine compound (second stage of raising temperature). In the case of fluorine compound (I), the second stage of raising temperature is conducted within a temperature range of 450 to 660° C.

The molecular weight of fluorine compound (I) is desirably 3,500 to 6,500. At a molecular weight of less than 3,500, water repellency, durability, and sliding properties deteriorate, and at greater than 6,500, film formation properties deteriorate and the antireflective effect of the resulting antireflective film is affected.

When the above-mentioned fluorine compound (I) is employed as the fluorine-containing organic silicon compound, it is desirable that the above-mentioned first stage of raising temperature is conducted within 3 minutes and the second stage of raising temperature is conducted in not less than 30 seconds and not more than 2 minutes in view of achieving uniform film formation on multiple optical members without damaging (heat cracking) the antireflective film.

The above-mentioned fluorine-containing organic silicon compound desirably comprises the fluorine compound having a molecular weight of 300 to 700 represented by general formula (II) below:

wherein p denotes an integer of not less than 1.

Fluorine compound (II) is described in Japanese Patent No. 2,561,395. The following compounds are more specific examples, all of which are commercially available:

n-$CF_3CH_2CH_2Si(NH_2)_3$
n-Trifluoro(1,1,2,2-tetrahydro)propylsilazane,
n-$C_3F_7CH_2CH_2Si(NH_2)_3$
n-Heptafluoro(1,1,2,2-tetrahydro)pentylsilazane,
n-$C_4F_9CH_2CH_2Si(NH_2)_3$
n-Nonafluoro(1,1,2,2-tetrahydro)hexylsilazane,
n-$C_6F_{13}CH_2CH_2Si(NH_2)_3$
n-Trideofluoro(1,1,2,2-tetrahydro)octylsilazane,
n-$C_8F_{17}CH_2CH_2Si(NH_2)_3$,
n-Heptadecafluoro(1,1,2,2-tetrahydro)decylsilazane.

In the case of fluorine compound (II), the second stage of raising temperature is conducted at a temperature falling within a range of 400 to 610° C.

Further, when the above-mentioned fluorine compound (II) is employed as the fluorine-containing organic silicon compound, it is desirable that the first stage of raising temperature is conducted within 3 minutes and the second stage of raising temperature is conducted in not less than 30 seconds and not more than 2 minutes in view of achieving uniform film formation on multiple optical members without damaging (heat cracking) the antireflective film.

According to the method of the present invention, since the film is formed by vacuum vapor deposition, the refractive index and film thickness of the thin film can be freely controlled. That is, the intensity of water repellency can be controlled by controlling the refractive index of the thin film. Further, controlling the film thickness permits prevention of decrease in the intensity of water repellency and deterioration in antireflection characteristics (prevention of changes in interference color).

The optical member in the present invention means not only spectacle lenses, but also optical members in a broad sense, such as camera lenses, optical filters that are mounted on displays and the like, automotive window glass, and the like.

Examples of the optical substrate employed in the present invention are: plastic optical substrates such as methyl methacrylate homopolymer, copolymers having monomer components in the form of methyl methacrylate and one or more other monomers, diethyleneglycol bisallylcarbonate homopolymer, copolymers having monomer components in the form of diethyleneglycol bisallylcarbonate and one or more other monomers, sulfur-containing copolymers, halogen-containing copolymers, polycarbonates, polystyrene, polyvinyl chloride, unsaturated polyester, polyethylene terephthalate, and polyurethane, as well as inorganic glass optical substrates. The above-mentioned substrate may have a hard coat layer thereon. Examples of hard coating layers are hard films containing organic silicon compounds, acrylic compounds and the like.

The antireflective film (vapor deposited film) means a single film or multilayer film (where the outermost layer is an $SiO_2$ film) comprised of $ZrO_2$, $SiO_2$, $TiO_2$, $Ta_2O_5$, $Y_2O_3$, $MgF_2$, $Al_2O_3$ and the like or a coloring film such as $CrO_2$ (where the outermost layer is an $SiO_2$ film) provided to reduce reflection on the optical substrate surface of a lens or the like, for example.

EXAMPLES

The present invention will be described in greater detail below through examples.

The various physical properties of the plastic lenses obtained in the present examples and comparative examples were evaluated by the evaluation methods described below.

(1) Static Contact Angle with Water

Using a contact angle gage (Kyowa Kaimen Kagaku (K.K.) product, Model CA-D), a drop of water 1.5 mm in diameter was fashioned on a needle point at room temperature and contacted with the uppermost portion of the convex surface of a lens to create liquid droplets. The angle between the liquid droplets produced and the surface at that time was measured as the static contact angle.

(2) External Appearance

A visual inspection was made as to whether or not there was interference color irregularity or interference color change (a check was made to judge whether or not the lenses could be employed as spectacle lenses).

(3) Durability

Chamois skin was soaked for 5 minutes in 25° C. water and then retrieved into air. A 500 g load was placed on the chamois skin, it was rubbed 500 times against the surface of a plastic lens having a water-repellent film, and then the static contact angle with water was measured by the same method as described in (1) above.

(4) Sliding Property

The lens was slid back and forth under the conditions of an abrasion resistance test until it would slide no longer and the number of times until resistance was sensed was counted.

The water-repellency treatment agents employed in the present examples and comparative examples were prepared in the following manner.

(1) Water-Repellency Treatment Agent 1

A solution obtained by diluting a fluorine-containing organic silicon compound (with an average molecular weight of about 5,000) denoted in unit formula as $C_3F_7$—$(OCF_2CF_2CF_2)_{24}$—$O(CF_2)_2$—$[CH_2CH(Si$—$(OCH_3)_3)]_{1-10}$ with 3 weight percent of perfluorohexane was employed as the water-repellency treatment agent (fluorine compound (I))

(2) Water-Repellency Treatment Agent 2

A solution obtained by diluting a fluorine-containing organic silicon compound (with an average molecular weight of about 500) denoted in unit formula as $C_8F_{17}CH_2CH_2Si(NH_2)_3$ with 3 weight percent of n-xylene hexachloride was employed as the water-repellency treatment agent (fluorine compound (II)).

Example 1

A polythiourethane lens (Hi-Lux made by HOYA Corporation, refractive index 1.60, dipodric power 0.00) was employed as the plastic lens. The continuous-type vacuum vapor deposition device equipped with independent preheating chamber, first vapor deposition chamber, and second vapor deposition chamber shown in FIG. 1 was employed as the vacuum vapor deposition device. The above-mentioned plastic lens was installed on the lens supporting jig, introduced into the preheating chamber (CH1), heated for a prescribed period under vacuum, and transferred to the first vapor deposition chamber (CH2) already in a state of vacuum without contact with external air by an internally provided conveyor. An antireflective film was formed as set forth below in the first vapor deposition chamber.

First, an underlayer made of silicon dioxide (refractive index 1.46, film thickness 0.5 λ (where λ is 550 nm) was formed by vacuum vapor deposition method (degree of vacuum $2\times10^{-5}$ Torr) on the plastic lens that had been heated to a temperature suited to the vapor deposition. A first layer (refractive index 1.70, film thickness 0.24 λ) in the form of a three-layer equivalent film comprising a layer (film thickness 0.06 λ) made of titanium dioxide formed by an ion-beam assist method in which an oxygen ion beam was irradiated onto the plastic lens, a layer (film thickness 0.12 λ) made of silicon dioxide formed by vacuum vapor deposition method, and a layer (film thickness 0.06 λ) made of titanium dioxide formed by ion beam assist was formed over the underlayer. A second layer (refractive index 2.40, film thickness 0.5 λ) made of titanium dioxide was then formed over the first layer by an ion beam assist method in which an oxygen ion beam was irradiated onto the plastic lens. A third layer (refractive index 1.46, film thickness 0.25 λ) made of silicon dioxide was then formed by vacuum vapor deposition method (degree of vacuum $2 \times 10^{-5}$ Torr) over the second layer, yielding a plastic lens with an antireflective film. The luminous reflectance of the lens was 0.4 percent. In the vapor deposition step, the surface temperature of the plastic lens raised to a maximum of about 95° C.

The plastic lens on which the antireflective film had been formed was transferred without contact with external air by an internally provided conveyor to the second vapor deposition chamber (CH3) already in a state of vacuum. The water-repellent film was formed in the second vapor deposition chamber as follows.

A stainless steel sintered filter (mesh 80–120 μm, 18φ×3 mm) into which 0.75 mL of the above-described water repellency treatment agent 1 was impregnated was placed in the vacuum vapor deposition device and heated with a heater having a built-in halogen lamp. The heating temperature was raised to 550° C. over 3 minutes (heater output 3.5 A) and from 550° C. to 600° C. over 2 minutes (heater output 2.5 A). The degree of vacuum in the device was $10^{-3}$ Torr. The rate of rotation of the lens-supporting jig was 1,000–1,300 rpm. The water repellency treatment agent began to evaporate at about 570° C. Following vapor deposition, the lens was left standing for a prescribed period within the second vapor deposition chamber and cooled, after which it was removed.

Table 1 shows the physical properties of the lens with water-repellent film produced in this manner. The static contact angle was 109.8°. No interference color irregularity or interference color change was observed and durability was good. The sliding property greatly exceeded that of prior art products.

Example 2

Figure 3:
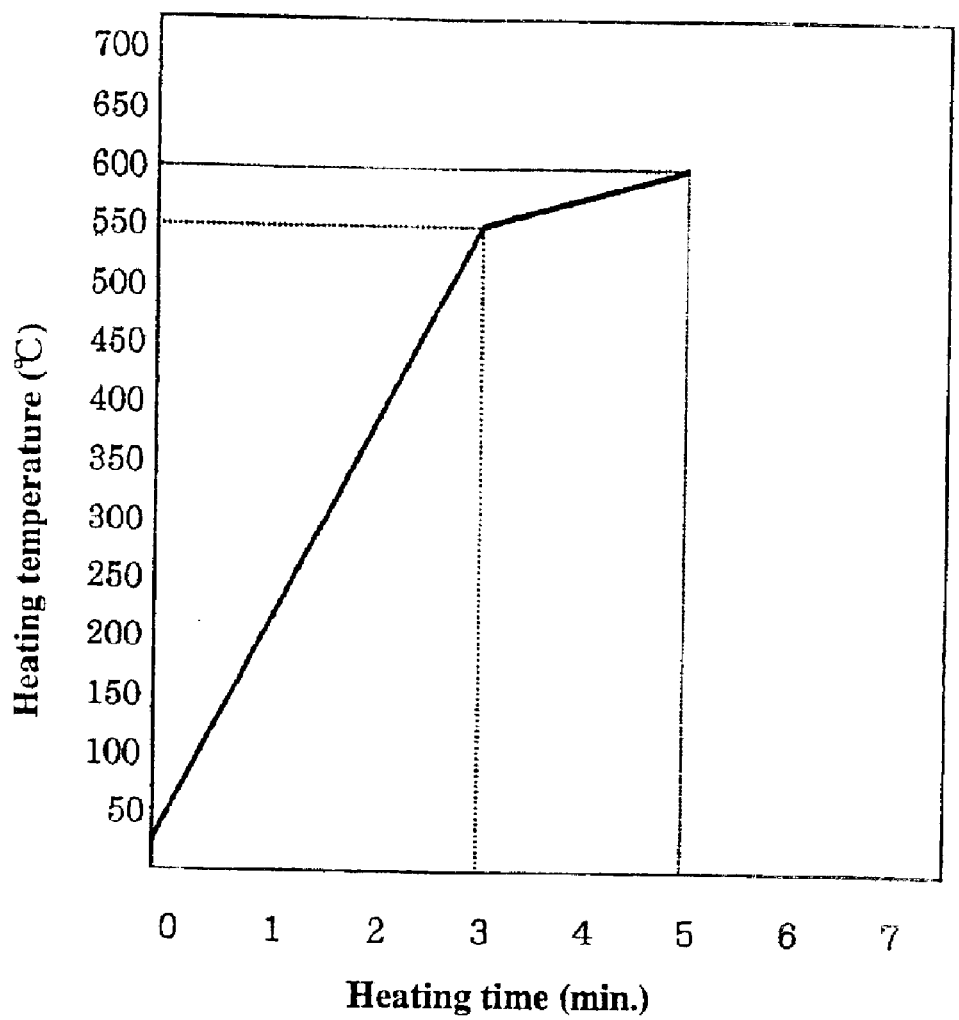
FIG. 3 is a graph showing the setting temperature of the program controller of the heating device in Example 2.
Figure 4:
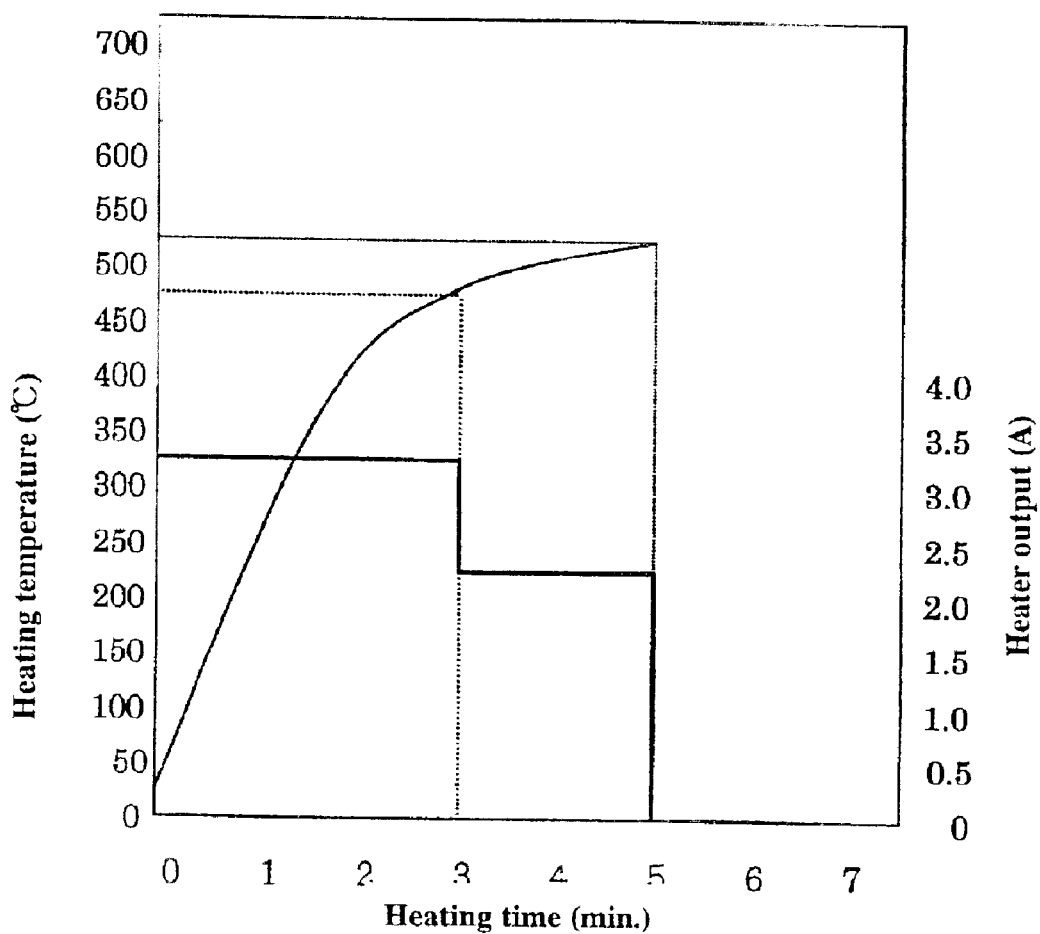
FIG. 4 is a graph showing the temperature of the sintered filter and the output value of the heating device in Example 3.

Control of raising temperature was conducted with a program controller. FIG. 3 shows the setting values of the program controller. The program controller adjusted the output of the heater to achieve the setting values; the actual increase in temperature exhibited nearly the same change as the setting values. Otherwise, the same procedure was conducted as in Example 1. Table 1 shows the physical properties of the lens with water-repellent film produced in this manner. The evaluation results of the lens obtained were nearly identical to those of the lens in Example 1.

Example 3

Water-repellency treatment agent 2 was employed. The water-repellent treatment agent was heated from an ordinary temperature to 475° C. over 3 minutes (heater output 3.2 A) and from 475° C. to 525° C. over 2 minutes (heater output 2.2 A). Otherwise, the same procedure was conducted as in Example 1. Table 1 shows the physical properties of the lens with water-repellent film thus obtained. As a result, the static contact angle was 110.0° and durability was 97.0 degrees.

Example 4

Figure 5:
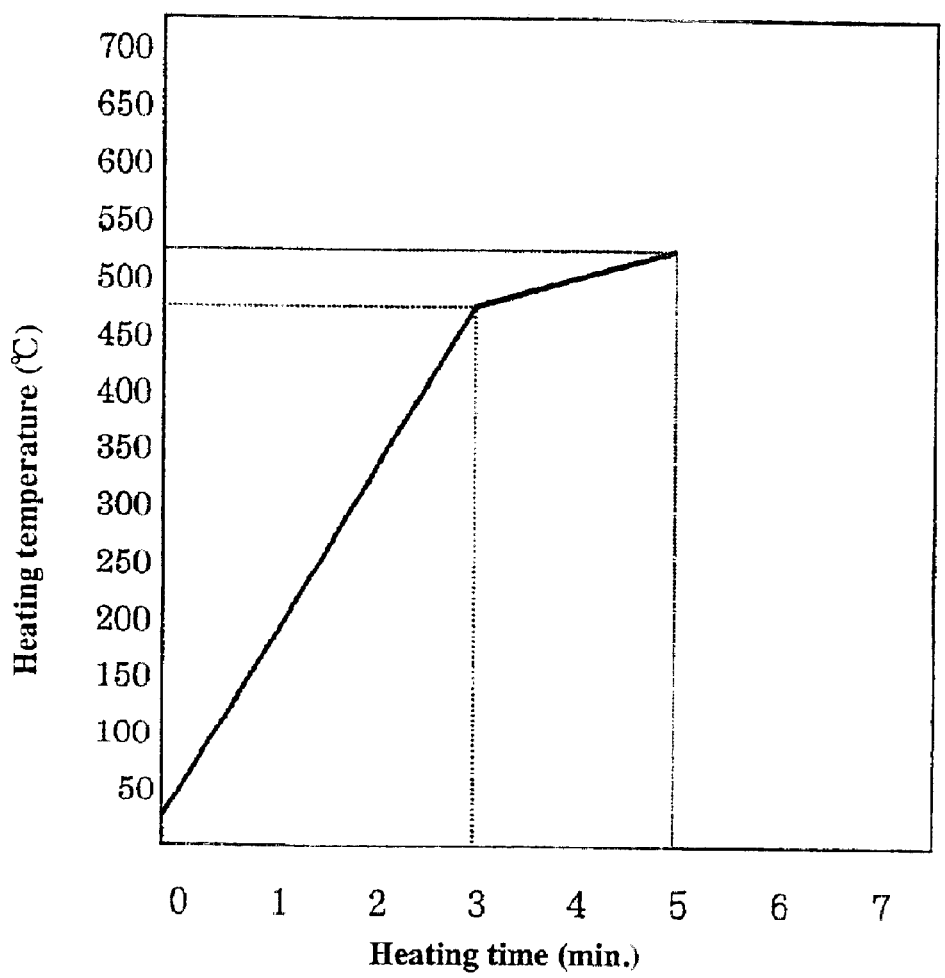
FIG. 5 is a graph showing the setting temperature of the program controller of the heating device in Example 4.

Control of raising temperature was conducted with a program controller. FIG. 5 shows the setting values of the program controller. Otherwise, the same procedure was conducted as in Example 3. Table 1 shows the physical properties of the lens with water-repellent film thus obtained. The evaluation results of the lens obtained were nearly identical to those of the lens in Example 3.

Example 5

Whether or not irregularities in static contact angle and interference color exhibited was confirmed for 113 lenses processed with the same lens supporting jig and manufactured by the same method as in Example 3. The degree of irregularity in static contact angle was calculated as the standard deviation. The results are shown in Table 1.

Comparative Example 1

The temperature was linearly raised over 3 minutes 10 seconds to 525° C. with a program controller (rate of raising temperature about 2.63° C./s). Irregularities in static contact angle and interference color were confirmed in the same manner as in Example 5 for the lens thus produced. Table 1 shows the physical properties of the lens with water-repellent film. As a result, it was found that irregularities were large. It is considered that the nonuniform adhesion of the vapor deposited film was attributed to the short evaporation time.

Comparative Example 2

The temperature was linearly raised over 10 minutes to 525° C. using a program controller (rate of raising temperature about 0.83° C./s). Otherwise, the same procedure was conducted as in Example 3. Irregularities in static contact angle and interference color were confirmed in the same manner as in Example 5. Table 1 shows the results. The static contact angle was about the same value as in Example 3. Although there was few irregularities, the antireflective film cracked. It is considered that the rise in lens surface temperature was attributed to the long period of heating.

Reference Example 1

A plastic lens with an antireflective film was placed in a batch-type vacuum vapor deposition device (comprising a single vapor deposition chamber) and vapor deposition was conducted. The same procedure as in Example 1 was conducted until the antireflective film was vapor deposited. Vapor deposition treatment agent 2 was charged to a metal container with electrodes and the temperature was raised over 45 seconds to 235° C. The degree of vacuum was $10^{-5}$. In this case, since the degree of vacuum was high, it was possible to raise the temperature quickly at a low evaporation starting temperature. Further, since it was possible to achieve adequate distance between the vapor deposition source and the vapor deposited product in this type of vapor deposition device, and there were few impediments, no irregularity was made even if the rate of raising temperature was fast. Table 1 shows the physical characteristics of the lens with water-repellent film that was obtained.

Reference Example 2

A plastic lens with antireflective film prepared by the same method as in Example 1 was prepared without a water-repellent film. Table 1 shows the physical properties of the lens with antireflective film that was obtained. The static contact angle measured was 7°.

The evaluation results of the above-described examples and comparative examples are summarized in the table below.

TABLE 1

|  | Static contact angle | Durability | Sliding property | Standard deviation | External appearance |
|---|---|---|---|---|---|
| Example 1 | 109.8° | 102.0° | 42 times | — | Good |
| Example 2 | 110.2° | 103.0° | 44 times | — | Good |
| Example 3 | 110.0° | 97.0° | 15 times | — | Good |
| Example 4 | 110.5° | 96.4° | 14 times | — | Good |
| Example 5 | 107–112° (Average 110°) | — | — | 1.9 | Good |
| Comp. Ex. 1 | 75–114° (Average 103°) | — | — | 9.2 | Irregularities in interference color were made. |
| Comp. Ex. 2 | 110–112° (Average 111°) | — | — | 0.9 | Antireflective film cracked. |
| Reference Ex.1 | 110.0° | 98.0° | 14 times | — | — |
| Reference Ex.2 | 7.0° | — | — | — | — |

The present invention can provide a method for manufacturing an optical member having a water-repellent thin film, in which the deterioration of an antireflective film due to cracking caused by heat can be prevented without loss of water-repellent film characteristics or nonuniformity during formation of the water-repellent film, thus shortening production time, even when a fluorine-containing organic silicon compound of relatively high molecular weight is vapor deposited under relatively low degree of vacuum.

The present disclosure relates to the subject matter contained in Japanese Patent Application No. 2001-133577 filed on Apr. 27, 2001, which is expressly incorporated herein by reference in its entirety.

What is claimed is:

1. A method for manufacturing an optical member having a water-repellent thin film wherein an antireflective film is vapor deposited on a plastic optical member and then a water-repellent thin film is vapor deposited on the antireflective film, wherein said vapor deposition of the water-repellent thin film is conducted by heating and evaporating a fluorine-containing organic silicon compound under condition in which the temperature of said plastic optical member does not exceed the maximum temperature at which the plastic optical member is exposed during the vapor deposition of the antireflective film, and adhering the evaporated fluorine-containing organic silicon compound on the plastic optical member having the antireflective film, and said heating is conducted so as to comprise a first stage of raising temperature where the temperature is raised from a starting temperature to the prescribed temperature (1) not exceeding the starting temperature of vapor deposition of said fluorine-containing organic compound, and a second stage of raising temperature where the temperature is raised from said prescribed temperature (1) to the prescribed temperature (2) equal to or higher than said starting temperature of vapor deposition, with the rate of raising temperature of the first stage of raising temperature higher than the rate of raising temperature of the second stage of raising temperature; wherein (i) said vapor deposition of the antireflective film and said vapor deposition of the water-repellent thin film are conducted by sequentially moving a jig for holding multiple plastic optical members to a chamber for vapor deposition of said antireflective film and to a chamber for vapor deposition of said water-repellent thin film; and (ii) said chamber for vapor deposition of said water-repellent thin film has an opening and closing mechanism for retrieving said jig outside the chamber, wherein vacuum in said chamber is broken when said opening and closing mechanism is opened.

2. The method for manufacturing according to claim 1, wherein said evaporation of fluorine-containing organic silicon compound is conducted by heating a porous material impregnated with said fluorine-containing organic silicon compound with a heating means.

3. The method for manufacturing according to claim 1, wherein said fluorine-containing organic silicon compound comprises a fluorine compound having a molecular weight of 3,500 to 6,500 represented by general formula (I)

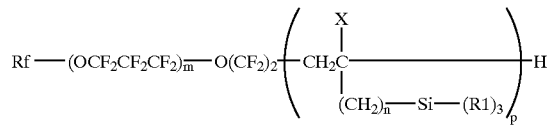

wherein Rf denotes a straight-chain perfluoroalkyl group having 1–16 carbon atoms, X denotes hydrogen or a lower alkyl group, R1 denotes a hydrolysable group, m denotes an integer of 1–50, n denotes an integer of 0–2, and p denotes an integer of 1–10.

4. The method for manufacturing according to claim 3, wherein said second stage of raising temperature is conducted at a temperature within a range of 450 to 660° C.

5. The method for manufacturing according to claim 4, wherein the rate of raising temperature in said second stage of raising temperature ranges from 0.4° C./s to 1.7° C./s.

6. The method for manufacturing according to claim 3, wherein the rate of raising temperature in said second stage of raising temperature ranges from 0.4° C./s to 1.7° C./s.

7. The method for manufacturing according to claim 1, wherein said fluorine-containing organic silicon compound comprises a fluorine compound having a molecular weight of 300 to 700 represented by general formula (II) below:

$$C_pF_{2p+1}CH_2CH_2Si(NH)_{1.5}$$

wherein p denotes an integer of not less than 1.

8. The method for manufacturing according to claim 7, wherein said second stage of raising temperature is conducted at a temperature within a range of 400 to 610° C.

9. The method for manufacturing according to claim 8, wherein the rate of raising temperature in said second stage of raising temperature ranges from 0.4° C./s to 1.7° C./s.

10. The method for manufacturing according to claim 7, wherein the rate of raising temperature in said second stage of raising temperature ranges from 0.4° C./s to 1.7° C./s.

* * * * *